United States Patent
Oda et al.

(10) Patent No.: US 12,463,172 B2
(45) Date of Patent: *Nov. 4, 2025

(54) AG ALLOY BONDING WIRE FOR SEMICONDUCTOR DEVICES AND SEMICONDUCTOR DEVICE

(71) Applicants: NIPPON MICROMETAL CORPORATION, Saitama (JP); NIPPON STEEL Chemical & Material Co., Ltd., Tokyo (JP)

(72) Inventors: Daizo Oda, Saitama (JP); Takumi Ookabe, Saitama (JP); Motoki Eto, Saitama (JP); Noritoshi Araki, Saitama (JP); Ryo Oishi, Saitama (JP); Teruo Haibara, Saitama (JP); Tomohiro Uno, Tokyo (JP); Tetsuya Oyamada, Tokyo (JP)

(73) Assignees: NIPPON MICROMETAL CORPORATION, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 502 days.

This patent is subject to a terminal disclaimer.

(21) Appl. No.: 17/916,935

(22) PCT Filed: Mar. 29, 2021

(86) PCT No.: PCT/JP2021/013364
§ 371 (c)(1),
(2) Date: Oct. 4, 2022

(87) PCT Pub. No.: WO2021/205931
PCT Pub. Date: Oct. 14, 2021

(65) Prior Publication Data
US 2023/0154884 A1 May 18, 2023

(30) Foreign Application Priority Data

Apr. 7, 2020 (JP) ................................. 2020-068997

(51) Int. Cl.
*H01L 23/49* (2006.01)
*H01L 23/00* (2006.01)

(52) U.S. Cl.
CPC .............. *H01L 24/45* (2013.01); *H01L 24/43* (2013.01); *H01L 24/48* (2013.01); *H01L 2224/43848* (2013.01); *H01L 2224/45139* (2013.01); *H01L 2224/48465* (2013.01)

(58) Field of Classification Search
CPC .......................................... H01L 2224/45139
See application file for complete search history.

(56) References Cited

U.S. PATENT DOCUMENTS

| 11,612,966 B2 * | 3/2023 | Oyamada | B23K 35/3006 |
| | | | 420/503 |
| 2017/0110430 A1 | 4/2017 | Oyamada et al. | |
| 2017/0365576 A1 | 12/2017 | Oyamada et al. | |
| 2018/0374816 A1 | 12/2018 | Oda et al. | |
| 2020/0340079 A1 | 10/2020 | Fukuoka et al. | |

FOREIGN PATENT DOCUMENTS

| CN | 104009015 A | * | 8/2014 | ............ H01L 24/43 |
| EP | 3029167 A1 | | 6/2016 | |
| EP | 3382747 A1 | | 10/2018 | |
| JP | H11-288962 A | | 10/1999 | |
| JP | 2012-169374 A | | 9/2012 | |
| JP | 2016-115875 A | | 6/2016 | |
| JP | 2017-212457 A | | 11/2017 | |
| TW | 201816129 A | | 5/2018 | |
| TW | 201928073 A | | 7/2019 | |
| WO | 2016/006326 A1 | | 1/2016 | |

OTHER PUBLICATIONS

English Translation of CN-104009015-A (Year: 2014).*
Office Action dated Nov. 25, 2024, from corresponding Singapore patent application No. 11202253847C, 9 pages.
Office Action issued in the corresponding Taiwanese patent Application No. 110112313 dated May 20, 2024. w/English Translation.
International Search Report issued in corresponding International Patent Application No. PCT/JP2021/013364, filed Jun. 22, 2021, with English translation.

* cited by examiner

*Primary Examiner* — Daniel Luke
(74) *Attorney, Agent, or Firm* — Rimon P.C.

(57) ABSTRACT

There is provided an Ag alloy bonding wire for semiconductor devices which exhibits a favorable bond reliability in a high-temperature environment even when using a mold resin of high S content and can suppress a chip damage at the time of ball bonding. The Ag alloy bonding wire is characterized by containing at least one element selected from the group consisting of Pd and Pt (hereinafter referred to as a "first element") and at least one element selected from the group consisting of P, Cr, Zr and Mo (hereinafter referred to as a "second element") so as to satisfy $0.05 \leq x1 \leq 3.0$, and $15 \leq x2 \leq 700$ where x1 is a total concentration of the first element [at. %] and x2 is a total concentration of the second element [at. ppm],
with the balance including Ag.

8 Claims, No Drawings

AG ALLOY BONDING WIRE FOR SEMICONDUCTOR DEVICES AND SEMICONDUCTOR DEVICE

CROSS-REFERENCE OF RELATED APPLICATIONS

This application is the U.S. National Phase under 35 U.S.C. § 371 of International Patent Application No. PCT/JP2021/013364, filed on Mar. 29, 2021, which in turn claims the benefit of Japanese Patent Application No. 2020-068997, filed on Apr. 7, 2020, the entire disclosures of which Applications are incorporated by reference herein.

TECHNICAL FIELD

The present invention relates to an Ag alloy bonding wire for semiconductor devices. The present invention further relates to a semiconductor device including the Ag alloy bonding wire.

BACKGROUND ART

In a semiconductor device, electrodes formed on a semiconductor element are connected with electrodes on a lead frame or a substrate using a bonding wire. Gold (Au) has been the common material of bonding wires, but recently the development of the bonding wire using a relatively inexpensive material as a replacement for Au is actively made because of the sharp rise of Au prices. For example, copper (Cu) has been examined for the low cost wire material as a replacement for Au, and there are reported a Cu wire and a Cu wire in which a palladium (Pd) coating is provided on the surface thereof for suppressing oxidation and the like.

Since the Cu wire and the Pd-coated Cu wire are harder than the Au wire and tend to cause problems at the time of being connected to electrodes and the like, the material of lower hardness is demanded. As for the wire material, silver (Ag) is expected because it has an electrical conductivity equal to or higher than Au and provides a lower hardness than Cu.

Regarding the Ag wire, it has been confirmed that the Ag wire may be inferior in a bond reliability compared to the Au wire. As a technique for improving the bond reliability of the Ag wire, there has been reported the technique of adding a specific element such as Pd, Pt and Au into the Ag wire to form alloy. For example, Patent Literature 1 discloses an Ag alloy bonding wire in which one or two or more of Pd, Pt, Cu, Ru, Os, Rh, Ir is contained in a range of 0.1 to 108 by weight in total, and Pd content is 10% by weight or less, Pt content is 10% by weight or less, Cu content is 5% by weight or less, Ru content is 18 by weight or less, Os content is 18 by weight or less, Rh content is 18 by weight or less and Ir content is 1% by weight or less. Patent Literature 2 discloses an Ag—Au—Pd ternary alloy bonding wire for semiconductor devices made from Ag having a purity of 99.99 mass % or higher, Au having a purity of 99.999 mass& or higher and Pd having a purity of 99.99 mass, the wire being composed of 4-10 mass % of Au, 2-5 mass % of Pd, 15-70 mass ppm of oxidizing non-noble metallic elements and residual % of Ag, and the wire being thermally annealed at least once before being continuously drawn through dies, and the wire being thermally tempered after being continuously drawn through die, and the wire being applicable for ball bonding in a nitrogen atmosphere.

RELATED ART REFERENCE

Patent Literature

Patent Literature 1: JP-A-H11-288962
Patent Literature 2: JP-A-2012-169374

SUMMARY OF INVENTION

Problem to be Solved by the Invention

In on-vehicle semiconductor devices, further improvement of the bond reliability is required. Specifically, it is required to achieve the favorable bond reliability even in a high-temperature environment of 175° C. or more. Here, a mold resin (an epoxy resin) as a package of a semiconductor device contains a silane coupling agent. In on-vehicle semiconductor devices which require a reliability at a higher temperature, a silane coupling agent of a high sulfur(S) content is added to the mold resin in order to achieve a high adhesiveness.

The S content of the mold resin tends to be increased recently. The commercially available epoxy resin which contains the S-containing silane coupling agent has been used conventionally. The S content of a recent epoxy resin increases compared to that of the conventional one, for the purpose of improving the adhesiveness of the mold resin with respect to the lead frame and the semiconductor chip. When trying to apply the Ag wire to the system in which such a mold resin of a high S content is used, it was found that the bond reliability of the connection part with the electrode, particularly of the ball bonded part deteriorated in some cases even when the Ag alloy wires containing the specific element as disclosed in Patent Literatures 1 and 2 were used. The bond reliability in a high-temperature environment is somewhat improved by increasing the content of the specific element, but in such a case, a damage of the semiconductor chip (hereinafter also referred to "chip damage") is found to be occurred at the time of ball bonding.

An object of the present invention is to provide an Ag alloy bonding wire which exhibits a favorable bond reliability in a high-temperature environment even when using a mold resin of high S content and can suppress a chip damage at the time of ball bonding.

Means for Solving Problem

As a result of earnest investigation as to the problem described above, the present inventors have found that the problem described above can be solved by the bonding wire having the configuration described below, and completed the present invention.

That is, the present invention includes the following content.

[1] An Ag alloy bonding wire for semiconductor devices, comprising at least one element selected from the group consisting of Pd and Pt (hereinafter referred to as a "first element") and at least one element selected from the group consisting of P, Cr, Zr and Mo (hereinafter referred to as a "second element") so as to satisfy $$0.05 \leq x1 \leq 3.0, \text{ and}$$

$$15 \leq x2 \leq 700$$

where x1 is a total concentration of the first element [at. %] and x2 is a total concentration of the second element [at. ppm], with the balance comprising Ag.

[2] The Ag alloy bonding wire according to [1], wherein a total concentration of In, Ga, Cd and Sn is less than 0.05 at. %.

[3] The Ag alloy bonding wire according to [1] or [2], wherein a total concentration of other elements calculated by the following Formula (1) is less than 0.05 at. %, $$100-(x_1+x_2+x_{Ag}) \text{ [at. \%]} \quad \text{Formula (1):}$$

where $x_1$ is a total concentration of the first element [at. %], $x_2$ is a total concentration of the second element [at. %] and $x_{Ag}$ is a concentration of Ag [at. %].

[4] The Ag alloy bonding wire according to any one of [1] to [3], wherein the balance consists of Ag and inevitable impurities.

[5] The Ag alloy bonding wire according to any one of [1] to [4], wherein the concentration of each element is measured by an ICP emission spectrometry or an ICP mass spectrometry.

[6] The Ag alloy bonding wire according to any one of [1] to [5], wherein the Ag alloy bonding wire does not have a coating that contains a metal other than Ag as a main component.

[7] A semiconductor device comprising the Ag alloy bonding wire according to any one of [1] to [6].

Effect of the Invention

The present invention can provide an Ag alloy bonding wire which exhibits a favorable bond reliability in a high-temperature environment even when using a mold resin of high S content and can suppress a chip damage at the time of ball bonding.

EMBODIMENT FOR CARRYING OUT THE INVENTION

Hereinafter, the present invention will be described in detail based on a preferred embodiment thereof.

[Ag Alloy Bonding Wire for Semiconductor Devices]

An Ag alloy bonding wire for semiconductor devices according to the present invention (hereinafter also referred to as a "wire of the present invention" or a "wire") is characterized in that the Ag alloy bonding wire contains at least one element selected from the group consisting of Pd and Pt (hereinafter referred to as a "first element") and at least one element selected from the group consisting of P, Cr, Zr and Mo (hereinafter referred to as a "second element") so as to satisfy $0.05 \leq x1 \leq 3.0$, and $15 \leq x2 \leq 700$ where x1 is a total concentration of the first element [at. &] and x2 is a total concentration of the second element [at. ppm], and the balance includes Ag.

There is reported a technique of improving a bond reliability of an Ag wire by adding the first element of Pd and Pt to the Ag wire. However, as mentioned above, the present inventors have found that, as for the semiconductor devices using the mold resin of a high S content, the bond reliability of the connection part with the electrode, particularly of the ball bonded part sometimes deteriorated in a high-temperature environment of 175° C. or more even when the Ag alloy wires containing the first element were used. Sulfur(S) contained in the mold resin tends to be freed in a high-temperature environment of 175° C. or more. It is estimated that, when the free S comes in contact with the Ag wire, the corrosion of the Ag wire progresses to result in the deterioration of the bond reliability. Based on the fact that the bond reliability of the connection part with the electrode, particularly of the ball bonded part deteriorates, it is estimated that the intermetallic compound (for example, $Ag_3Al$) generated at the connection interface due to a diffusion bonding of the Ag wire and the electrode material (for example, Al) is readily corroded by the free S.

The bond reliability in a high-temperature environment is somewhat improved by increasing the content of the first element of Pd and Pt. However, in such a case, the problem arises such that the wire hardens to generate the chip damage or the specific resistance of the wire increases, and thereby, the intrinsic excellent characteristics of Ag cannot be achieved. Furthermore, it has been confirmed that, when the S content of the mold resin is high, the deterioration of the bond reliability in a high-temperature environment is hard to be prevented even if adjusting the content of the first element.

In contrast, the wire of the present invention that contains the second element of P, Cr, Zr and Mo in addition to the first element described above can achieve a favorable bond reliability in a high-temperature environment even when using the mold resin of a high S content. When forming an FAB (Free Air Ball) using the wire of the present invention that contains the second element in addition to the first element and observing the FAB with an SEM, deposits with a diameter of about a few tens of nanometers were found on a surface of the FAB. From an analysis on the deposits by energy dispersive X-ray spectroscopy (EDS), it was revealed that the second element was concentrated. Although a detailed mechanism is unclear, it is considered that as these deposits observed on the FAB become present at the bonding interface of the wire and the electrode, the free S is trapped with (formed a compound with) these deposits before affecting on the intermetallic compound at the bonding interface for example, whereby improving the bond reliability of the ball bonded part in a high-temperature environment. Accordingly, in a preferable embodiment, the wire of the present invention is characterized in that, when forming an FAB using the wire, the deposits in which the second element is concentrated generate on the surface of the FAB. Further, the wire of the present invention containing the first element and the second element in combination can suppress the generation of the chip damage because the wire of the present invention can improve the bond reliability in a high-temperature environment without excessively increasing the amount of the first element to be added. In view of the above, the present invention provides an Ag alloy bonding wire which exhibits a favorable bond reliability in a high-temperature environment while suppressing the generation of the chip damage even when using a mold resin of high S content, and thus the present invention contributes to the practical use of the Ag wire for the on-vehicle semiconductor devices. The wire of the present invention that can improve the bond reliability in a high-temperature environment without excessively increasing the amount of the first element to be added is advantageous because it can also prevent a problem of the increase of the specific resistance.

—First Element—

The wire of the present invention contains, as a first element, at least one element selected from the group consisting of Pd and Pt in a range from 0.05 to 3.0 at. %. That is, it satisfies 0.05 $ x1≤3.0 where x1 is the total concentration of the first element [at. %] in the wire.

From a viewpoint of achieving a favorable bond reliability in a high-temperature environment even when using a mold resin of high S content, the total concentration of the first element in the wire, that is, x1 is 0.05 at. % or more, and is preferably 0.1 at. % or more, 0.2 at.& or more, 0.3 at. % or more, 0.4 at.& or more, 0.5 at.& or more, 0.6 at. % or more, 0.8 at. % or more, or 1.0 at.& or more, in combination with the second element described below. In particular, when x1 is more than 1.0 at.&, it is preferable because the wire of the present invention can achieve a particularly favorable bond reliability in a high-temperature environment even when using a mold resin of high S content. In addition, when x1 is more than 1.0 at. &, the wire of the present invention can also achieve an effect of readily controlling the compression bonding shape of the ball bonded part (the crushed shape of ball) to a shape close to a true circle. x1 is more preferably 1.1 at. & or more, 1.2 at. & or more, 1.3 at. % or more, 1.4 at. % or more, or 1.5 at. % or more.

From a viewpoint of preventing hardening of the wire and suppressing the chip damage, the upper limit of the total concentration of the first element in the wire x1 is 3.0 at. % or less, and is preferably 2.9 at. % or less, 2.8 at. % or less, 2.7 at. % or less, 2.6 at. % or less, or 2.5 at. % or less. As mentioned above, the wire of the present invention containing the first element and the second element in combination can improve the bond reliability in a high-temperature environment without excessively increasing the amount of the first element to be added.

—Second Element—

The wire of the present invention contains, as a second element, at least one element selected from the group consisting of P, Cr, Zr and Mo in a range from 15 to 700 at. ppm. That is, it satisfies 15 $ x2≤700 where x2 is the total concentration of the second element [at. ppm] in the wire.

From a viewpoint of achieving a favorable bond reliability in a high-temperature environment even when using a mold resin of high S content, the total concentration of the second element in the wire, that is, x2 is 15 at. ppm or more, and is preferably 30 at. ppm or more, 40 at. ppm or more, 50 at. ppm or more, 60 at. ppm or more, 80 at. ppm or more, 100 at. ppm or more, 150 at. ppm or more, 200 at. ppm or more, 250 at. ppm or more, or 300 at. ppm or more. In addition, when x2 falls within the above range, the wire of the present invention can also achieve an effect of readily controlling the compression bonding shape of the ball bonded part (the crushed shape of ball) to a shape close to a true circle. If the concentration of the first element x1 is more than 2 at. & (for example, 2.03 at. & or more, 2.05 at. & or more, 2.1 at. & or more), it has been confirmed that the wire of the present invention can achieve an extremely favorable bond reliability in a high-temperature environment even when using a mold resin of high S content and can achieve a particularly favorable compression bonding shape of the ball bonded part, even when the total concentration of the second element x2 is less than 35 at. ppm (for example, 34.5 at. ppm or less, 34.3 at. ppm or less, 34 at. ppm or less), that is, x2 falls within a very small amount range such as 15 at. ppm or more and less than 35 at. ppm. For example, when the concentration of the first element x1 is more than 2 at. % (for example, 2.03 at. & or more, 2.05 at. % or more, 2.1 at. & or more), it has been confirmed that the wire of the present invention can achieve the remarkable effect described above even when using P alone, Cr alone, Zr alone, Mo alone, or two or more of P, Cr, Zr and Mo in combination as the second element and the concentration thereof x2 being less than 35 at. ppm (for example, 34.5 at. ppm or less, 34.3 at. ppm or less, 34 at. ppm or less), that is, x2 falling within a very small amount range such as 15 at. ppm or more and less than 35 at. ppm.

From a viewpoint of achieving a favorable initial bonding strength of the ball bonded part and thus achieving a favorable bond reliability in a high-temperature environment, the upper limit of the total concentration of the second element in the wire x2 is 700 at. ppm or less, and is preferably 650 at. ppm or less, 600 at. ppm or less, 550 at. ppm or less, or 500 at. ppm or less. In particular, when x2 is 500 at. ppm or less, it is preferable because the wire of the present invention can achieve a particularly high initial bonding strength of the ball bonded part and thus achieving a particularly favorable bond reliability in a high-temperature environment. In addition, when x2 falls within the above range, the wire of the present invention can also achieve an effect of preventing hardening of the wire and readily suppressing the chip damage.

The wire of the present invention contains the first element and the second element in combination and the balance includes Ag. In the wire of the present invention, from a viewpoint of further achieving the effect of the present invention in combination with the first element and the second element described above, the concentration of Ag with respect to the entire wire is preferably 95 at. & or more, more preferably 96 at. % or more, 96.5 at. % or more, 96.6 at. % or more, 96.7 at. % or more, or 96.8 at. & or more.

In a range of not inhibiting the effect of the present invention, the wire of the present invention may further contain the dopant element(s) other than the first element and the second element. The total concentration of such dopant element(s) in the wire is not limited so long as it does not inhibit the effect of the present invention. The total concentration of the dopant element(s) may be, for example, less than 0.05 at. % (less than 500 at. ppm). Accordingly, a total concentration of other elements calculated by the following Formula (1) is less than 0.05 at. %, $$100-(x1+x2+x_{Ag}) \text{ [at. \%]} \quad \text{Formula (1):}$$

where $x_1$ is a total concentration of the first element [at. %], $x_2$ is a total concentration of the second element [at. %] and $x_{Ag}$ is a concentration of Ag [at. %].

The total concentration of the dopant element(s) other than the first element and the second element, that is, the "other elements" described above may be lower, and may be, for example, 0.045 at. % or less, 0.04 at. % or less, 0.035 at. % or less, 0.03 at. & or less, 0.025 at. % or less, 0.02 at. % or less, 0.015 at. % or less, less than 0.011 at. %, 0.01 at. % or less, 0.005 at. % or less, 0.003 at. % or less, 0.001 at. % or less, 0.0008 at. % or less, 0.0006 at. % or less, or 0.0005 at. & or less. Such dopant element(s) is not particularly limited so long as it does not inhibit the effect of the present invention, and examples thereof may include In, Ga, Cd, Sn, Cu, Zn, Fe, Ti, Mn, Mo, Ni, Au and the like. Accordingly, when using, for example, In, Ga, Cd and Sn as such dopant element(s), the total concentration of In, Ga, Cd and Sn may be less than 0.05 at. %. The lower limit of the total concentration of the dopant element(s) is not particularly limited, and may be 0 at. %.

In a preferable embodiment, the wire of the present invention contains the first element and the second element and the balance consists of Ag and inevitable impurities.

The concentration of elements contained in the wire of the present invention such as the first element, the second element and other dopant element(s) can be detected as the concentration of elements contained in the entire wire by analyzing a liquid in which the wire is dissolved with a strong acid using an ICP emission spectrometer or an ICP mass spectrometer. The concentration of each element specified in the present invention is based on the concentration measured by an ICP emission spectrometry or an ICP mass spectrometry.

The wire of the present invention preferably does not have a coating that contains a metal other than Ag as a main component. Accordingly, in a preferable embodiment, the wire of the present invention does not have a coating that contains a metal other than Ag as a main component. Herein, the "coating that contains a metal other than Ag as a main component" means the coating in which the content of the metal other than Ag is 50 at. & or more.

A diameter of the wire of the present invention is not particularly limited, and may be appropriately determined depending on specific purposes. Preferably, the diameter of the wire may be 15 µm or more, 18 µm or more, 20 µm or more, or the like. An upper limit of the diameter is not particularly limited, but may be 100 µm or less, 90 µm or less, 80 µm or less, or the like.

<Manufacturing Method for Wire>

There will be described an example of a method for manufacturing the Ag alloy bonding wire for semiconductor devices of the present invention.

Raw material silver (Ag) of a purity of 3 N to 5 N (99.9 to 99.999% by mass or more) is prepared. Then, after measuring a raw material Ag, the first element, the second element and other dopant element(s) as a starting material so that the concentration of the first element, the second element and other dopant element(s) (if contained) falls within the specific range described above, these materials are molten and mixed to obtain an Ag alloy. Alternatively, as the raw materials for the first element, the second element and other dopant element(s), a mother alloy containing these elements may be used. The resultant Ag alloy is processed to have a large diameter by continuous casting, and subsequently, thinned to have a final wire diameter by wire-drawing process.

The wire-drawing process can be performed by using a continuous wire-drawing machine in which a plurality of diamond-coated dies can be set. If necessary, heat treatment may be performed during the wire-drawing process.

After the wire-drawing process, a final heat treatment is performed. Regarding a temperature condition for the final heat treatment, for example, the breaking elongation of a heat-treated wire may be checked by changing only a temperature inside a furnace at a fixed wire feeding speed, and a heat treatment temperature may be determined so that the breaking elongation falls within a predetermined range. The heat treatment temperature may fall within a range from 200 to 600° C., for example. It is preferable that a time of the heat treatment is set to be, for example, 10 seconds or less (preferably, 5 seconds or less, 4 seconds or less, or 3 seconds or less). As an atmospheric gas for the heat treatment, there may be used an inert gas such as a nitrogen gas and an argon gas, or an inert gas containing hydrogen such as a forming gas (5% $H_2$—$N_2$).

The wire of the present invention can be used for connecting a first electrode on a semiconductor element to a second electrode on a lead frame or a circuit board when manufacturing the semiconductor device. First connection (1st bonding) with the first electrode on the semiconductor element may be ball bonding, and second connection (2nd bonding) with the electrode on the lead frame or the circuit board may be wedge bonding. In the ball bonding, a tip end of the wire is heated and molten by arc heat input to form a ball (FAB: Free Air Ball) by surface tension, and then this ball part is compression-bonded onto the electrode of the heated semiconductor element. In the wedge bonding, the wire part is compression-bonded onto the electrode by applying heat, ultrasonic waves, and pressure to the wire part without forming the ball. The wire of the present invention that contains the second element of P, Cr, Zr and Mo in addition to the first element of Pd and Pt can achieve a favorable bond reliability in a high-temperature environment even when using a mold resin of high S content for a sealing process after 1st bonding and 2nd bonding. Accordingly, the wire of the present invention may be used for the semiconductor devices, and may be preferably used for the semiconductor devices sealed (packaged) with a mold resin of a high S content.

[Method for Manufacturing Semiconductor Device]

The semiconductor device can be manufactured by connecting the electrode on the semiconductor element to the electrode on the lead frame or the circuit board by using the Ag alloy bonding wire for semiconductor devices of the present invention.

In an embodiment, the method for manufacturing the semiconductor device of the present invention (hereinafter also simply referred to as a "method of the present invention") includes a step of connecting the first electrode on the semiconductor element to the second electrode on the lead frame or circuit board with using the wire of the present invention, and is characterized in that the first connection between the first electrode and the wire of the present invention is performed by ball bonding and the second connection between the second electrode and the wire of the present invention is performed by wedge bonding.

When using the wire of the present invention containing the first element and the second element in combination, a favorable bond reliability in a high-temperature environment can be achieved even when using a mold resin of high S content for a sealing process. Accordingly, in a preferable embodiment, the method of the present invention further includes a step of sealing with a mold resin of high S content (for example, S content of 5 ppm by mass or more, 10 ppm by mass or more, or 15 ppm by mass or more) after bonding. When using the wire of the present invention, a favorable bond reliability in a high-temperature environment can be achieved regardless of the specifications of a mold resin, e.g., S content.

[Semiconductor Device]

The semiconductor device can be manufactured by connecting the electrode on the semiconductor element to the electrode on the lead frame or the circuit board by using the Ag alloy bonding wire for semiconductor devices of the present invention.

In an embodiment, the semiconductor device of the present invention includes a circuit board, a semiconductor element, and a bonding wire for electrically connecting the circuit board and the semiconductor element with each other, and is characterized in that the bonding wire is the wire of the present invention.

In the semiconductor device of the present invention, the circuit board and the semiconductor element are not particularly limited, and a known circuit board and semiconductor element that may be used for constituting the semiconductor device may be used. Alternatively, a lead frame may be used in place of the circuit board. For example, like the semiconductor device disclosed in JP 2002-246542 A, the semiconductor device may include a lead frame and a semiconductor element mounted on the lead frame.

Examples of the semiconductor device may include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like, and an on-vehicle semiconductor device required for achieving a favorable bond reliability in a high-temperature environment is preferred.

EXAMPLES

There will be specifically described the present invention with Examples. However, the present invention is not limited to the Examples described below.
(Sample)

For Ag as a raw material of the wire, Ag having a purity of 99.9 at.& or more with the balance composed of inevitable impurities was used. For the first element (Pd and Pt), the second element (P, Cr, Zr and Mo) and the other dopant elements (In, Cu and Ga), those having a purity of 99.9 at.& or more with the balance being composed of inevitable impurities were used.

The Ag alloy used for a bonding wire was manufactured by charging raw materials into a cylinder-shaped carbon crucible, heating and melting the raw materials at 1,080 to 1,600° C. in vacuum or in an inert atmosphere such as an $N_2$ or Ar gas using a high-frequency furnace. The resultant alloy was processed to form a wire of φ4 to 6 mm by continuous casting.

The obtained Ag alloy was subjected to wire-drawing process using dies to form a wire of φ300 to 600 μm. Then, the obtained wire was subjected to an intermediate heat treatment of 200 to 700° C. and a wire-drawing process repeatedly to have a final wire diameter of φ20 μm. A commercially available lubricant was used for the wire-drawing, and a wire feeding speed during the wire-drawing was 20 to 600 m/min. The intermediate heat treatment was performed while continuously sweeping the wire under an Ar gas atmosphere. A wire feeding speed during the intermediate heat treatment was 20 to 100 m/min.

After the wire-drawing process, the wire was subjected to the final heat treatment so that the breaking elongation of the wire was finally in a range of about 9 to 25%. The final heat treatment was performed in the same manner as the intermediate heat treatment. A wire feeding speed during the final heat treatment was 20 to 100 m/min similarly to the intermediate heat treatment. The temperature of the final heat treatment was 200 to 700° C. and the time of the heat treatment was 0.2 to 1.0 seconds. The concentration of the first element, the second element and other dopant elements in the bonding wire was detected as the concentration of elements contained in the entire wire by analyzing a liquid in which the bonding wire was dissolved with a strong acid using an ICP emission spectrometer or an ICP mass spectrometer.
(Test and Evaluation Methods)

There will be described test and evaluation methods.
[Evaluation of Bond Reliability in High-Temperature Environment]

A sample for bond reliability evaluation was prepared by performing ball bonding using a commercially available wire bonder on an electrode that had been formed by depositing an Al film having a thickness of 1.0 μm on a silicon substrate on a general metallic frame, and then sealing with an S-containing mold resin. For the S-containing mold resin, two types of epoxy resins with different S contents were used. Specifically, for the low concentration S-containing resin, the resin having an S content of 2 ppm by mass was used. For the high concentration S-containing resin, the resin having an S content of 16 ppm by mass was used. For the evaluation of S content in the epoxy resin, the resin was crushed and heated in a flow of nitrogen gas at 200° C. for 10 hours, the outgas from the resin contained in the carrier nitrogen gas was collected with hydrogen peroxide water, and the S content was evaluated by an ion chromatography. A ball was formed while flowing an $N_2+5\% \ H_2$ gas at a flow rate of 0.4 to 0.6 L/min, and the size of the ball was in a range from 1.5 to 1.6 times of the wire diameter.

The bond reliability in a high-temperature environment was evaluated by a High Temperature Storage Life Test (HTSL). Specifically, the bond reliability was determined based on the bonding life of the ball bonded part exposed to an environment with a temperature of 175° C. using a high-temperature thermostatic device. The shear test on the ball bonded part was performed every 250 hours, and a time until a value of shear force became half of the initial shear force was determined to be the bonding life of the ball bonded part. The shear test after the High Temperature Storage Life Test was performed after removing the resin by acid treatment, and exposing the ball bonded part.

For a shear tester for HTSL evaluation, a tester manufactured by DAGE was used. An average value of measurement values of 10 ball bonded parts randomly selected was used for the value of the shear force. Evaluation was then performed in accordance with the following criteria.
Evaluation Criteria:
  ⊚⊚: bonding life of 3000 hours or more
  ⊚: bonding life of 2000 hours or more and less than 3000 hours
  ○: bonding life of 1000 hours or more and less than 2000 hours
  x: bonding life of less than 1000 hours
[Chip Damage]

The evaluation of the chip damage was carried out by performing ball bonding using a commercially available wire bonder on an electrode that had been formed by depositing an Al film having a thickness of 1.0 μm on a Si substrate, dissolving the wire and the Al electrode with a chemical solution to expose the Si substrate, and observing the Si substrate directly below the ball bonded part by an optical microscope (the number of evaluations N=100). A case in which a damage was found was determined to be fault. Evaluation was then performed in accordance with the following criteria.
Evaluation Criteria:
  ⊚: 0 failure
  ○: 1 failure (no problem for practical use)
  x: 2 or more failures
[Compression Bonding Shape]

The evaluation of the compression bonding shape of the ball bonded part (the crushed shape of ball) was carried out by performing ball bonding using a commercially available wire bonder on an electrode that had been formed by depositing an Al film having a thickness of 1.0 μm on a Si substrate, and observing the ball bonded part from directly above by an optical microscope (the number of evaluations N=100). In the evaluation of the crushed shape of ball, a case in which a crushed shape was close to circle was determined to be favorable, and a case in which a crushed shape was an oval shape or a petal shape was determined to be fault. Evaluation was then performed in accordance with the following criteria.
Evaluation Criteria:
  ⊚: 0 failure
  ○: 1 to 4 failures (no problem for practical use)
  x: 5 or more failures

[Initial Bonding Strength]

The initial bonding strength of the ball bonded part was evaluated by performing ball bonding using a commercially available wire bonder on an electrode that had been formed by depositing an Al film having a thickness of 1.0 μm on a Si substrate, and performing the shear test on the ball bonded part. For a shear tester, a tester manufactured by DAGE was used. An average value of measurement values of 20 ball bonded parts randomly selected was used for the value of the shear force. Evaluation was then performed in accordance with the following criteria.

Evaluation Criteria:
  ⊚: average value of 16 gf or more
  ○: average value of 10 gf or more and less than 16 gf
  x: average value of less than 10 gf The evaluation results of Examples and Comparative Examples were shown in Tables 1 and 2.

achieved a favorable bond reliability in a high-temperature environment even when using a mold resin of high S content (high concentration S-containing resin) and was able to suppress the chip damage at the time of ball bonding.

Further, it was confirmed that Example Nos. 8 to 15, and 19 containing more than 1 at. % of the first element (especially, Example Nos. 8 to 11, 13 to 15, and 19 in which the content of the second element was 500 at. ppm or less) achieved a significantly excellent bond reliability in a high-temperature environment even when using a mold resin of high S content and also achieved a particularly favorable compression bonding shape of the ball bonded part. In addition, when the content of the first element was more than 2 at. %, it was confirmed that the wire achieved a significantly excellent bond reliability in a high-temperature environment even when using a mold resin of high S content and achieved a particularly favorable compression bonding

TABLE 1

| Examples No. | First element (at.%) Pd | Pt | Total | Second element (at.ppm) P | Cr | Zr | Mo | Total | Other element (at.ppm) | HTSL (175° C.) Low concentration S-containing resin | High concentration S-containing resin | Crushed shape | Chip damage | Initial bonding strength |
|---|---|---|---|---|---|---|---|---|---|---|---|---|---|---|
| 1 | 0.07 | | 0.07 | 300 | | | | 300 | | ⊚ | ○ | ○ | ⊚ | ⊚ |
| 2 | 0.05 | | 0.05 | 680 | | | | 680 | | ⊚ | ○ | ○ | ⊚ | ○ |
| 3 | 1 | | 1 | 30 | | | | 30 | | ⊚ | ○ | ○ | ⊚ | ⊚ |
| 4 | | 1 | 1 | | | 31 | | 31 | | ⊚ | ○ | ○ | ⊚ | ⊚ |
| 5 | 1 | | 1 | | | | 32 | 32 | | ⊚ | ○ | ○ | ⊚ | ⊚ |
| 6 | 0.5 | 0.5 | 1 | | 30 | | | 30 | | ⊚ | ○ | ○ | ⊚ | ⊚ |
| 7 | 0.8 | 0.2 | 1 | | | 15 | 18 | 31 | | ⊚ | ○ | ○ | ⊚ | ⊚ |
| 8 | 1.7 | | 1.7 | 300 | | | | 300 | | ⊚⊚ | ⊚ | ⊚ | ⊚ | ⊚ |
| 9 | 2.8 | | 2.8 | 200 | | | | 200 | | ⊚⊚ | ⊚ | ⊚ | ⊚ | ⊚ |
| 10 | | 2.9 | 2.9 | 80 | | | 20 | 100 | | ⊚⊚ | ⊚ | ⊚ | ⊚ | ⊚ |
| 11 | 1.4 | 1.4 | 2.8 | | 32 | | | 32 | | ⊚⊚ | ⊚ | ⊚ | ⊚ | ⊚ |
| 12 | | 1.5 | 1.5 | | | 600 | | 600 | | ⊚⊚ | ○ | ⊚ | ⊚ | ○ |
| 13 | 1.6 | | 1.6 | 300 | | | | 300 | In 495 | ⊚⊚ | ⊚ | ⊚ | ⊚ | ⊚ |
| 14 | 1.8 | | 1.8 | 300 | | | | 300 | Cu 490 | ⊚⊚ | ⊚ | ⊚ | ⊚ | ⊚ |
| 15 | | 2.8 | 2.8 | 80 | | | | 80 | Ga 495 | ⊚⊚ | ⊚ | ⊚ | ⊚ | ⊚ |
| 16 | 1 | | 1 | 15 | | | | 15 | | ⊚ | ○ | ○ | ⊚ | ⊚ |
| 17 | | 1 | 1 | | | | 18 | 18 | | ⊚ | ○ | ○ | ⊚ | ⊚ |
| 18 | 0.7 | 0.3 | 1 | | | 7 | 8 | 15 | | ⊚ | ○ | ○ | ⊚ | ⊚ |
| 19 | 2.1 | | 2.1 | 31 | | | | 31 | | ⊚⊚ | ⊚ | ⊚ | ⊚ | ⊚ | shape of the ball bonded part, even in a case where the total

TABLE 2

| Comparative Examples No. | First element (at.%) Pd | Pt | Total | Second element (at.ppm) P | Cr | Zr | Mo | Total | Other element (at.ppm) | HTSL (175° C.) Low concentration S-containing resin | High concentration S-containing resin | Crushed shape | Chip damage | Initial bonding strength |
|---|---|---|---|---|---|---|---|---|---|---|---|---|---|---|
| 1 | 0.04 | | 0.04 | | | | | 0 | | X | X | X | ⊚ | ⊚ |
| 2 | | 1.5 | 1.5 | | 10 | | | 10 | | ⊚ | X | X | ⊚ | ⊚ |
| 3 | 0.04 | | 0.04 | 100 | | | | 100 | | X | X | ○ | ⊚ | ⊚ |
| 4 | 3.4 | | 3.4 | | | | 300 | 300 | | ⊚⊚ | ⊚ | ⊚ | X | ⊚ |
| 5 | 0.03 | | 0.03 | 600 | | | | 600 | | X | X | ○ | ⊚ | ○ |
| 6 | | 3.5 | 3.5 | | 550 | | | 550 | | ⊚⊚ | ○ | ⊚ | X | ○ |
| 7 | | 0.04 | 0.04 | | | | 720 | 720 | | X | X | ○ | ⊚ | X |
| 8 | | 0.7 | 0.7 | | | 705 | | 705 | | X | X | ○ | ⊚ | X |
| 9 | 2 | | 2 | 800 | | | | 800 | | X | X | ⊚ | ⊚ | X |
| 10 | 3.1 | | 3.1 | | | 720 | | 720 | | X | X | ⊚ | X | X |
| 11 | 0.3 | | 0.3 | 13 | | | | 13 | | ○ | X | X | ⊚ | ⊚ |
| 12 | | 3.1 | 3.1 | | | 12 | | 12 | | ⊚⊚ | X | ○ | ○ | ⊚ |

Regarding all of Example Nos. 1 to 19, the contents of the first element and the second element fall within the range of the present invention, and it was confirmed that they concentration of the second element was a very small amount range such as 15 at. ppm or more and less than 35 at. ppm (Example Nos. 11 and 19).

On the other hand, it was confirmed that, in Comparative Example Nos. 1 to 12, the content of at least one of the first element and the second element was out of the range of the present invention, and it was confirmed that the bond reliability in a high-temperature was deteriorated when using a high concentration S-containing resin or the chip damage was occurred at the time of ball bonding.

The invention claimed is:

1. An Ag alloy bonding wire for semiconductor devices, comprising at least one first element selected from the group consisting of Pd and Pt and at least one second element selected from the group consisting of P, Cr, Zr and Mo so as to satisfy $0.05 \leq x1 \leq 3.0$, and $15 \leq x2 \leq 700$ where x1 is a total concentration of the first element by atomic percentage and x2 is a total concentration of the second element by atomic ppm,
with the balance comprising Ag,
wherein the Ag alloy bonding wire comprises at least Cr, Zr or Mo as the second element.

2. The Ag alloy bonding wire according to claim 1, wherein a total concentration of In, Ga, Cd, and Sn is 0 atomic percent or more and less than 0.05 atomic percent.

3. The Ag alloy bonding wire according to claim 1, wherein a total concentration of elements other than the first element, the second element, and Ag is 0 atomic percent or more and less than 0.05 atomic percent.

4. The Ag alloy bonding wire according to claim 1, wherein the concentration of each element is measured by an ICP emission spectrometry or an ICP mass spectrometry.

5. The Ag alloy bonding wire according to claim 1, wherein the Ag alloy bonding wire does not have a coating that contains a metal other than Ag as a main component.

6. A semiconductor device comprising the Ag alloy bonding wire according to claim 1.

7. The Ag alloy bonding wire according to claim 1, further comprising In, Ga, Cd, or Sn, wherein a total concentration of In, Ga, Cd, and Sn is more than 0 atomic percent and less than 0.05 atomic percent.

8. The Ag alloy bonding wire according to claim 1, further comprising In, Ga, Cd, or Sn, wherein a total concentration of In, Ga, Cd, and Sn is more than 0 atomic percent and less than 0.045 atomic percent.

* * * * *